(12) United States Patent
Ashida et al.

(10) Patent No.: US 11,653,573 B2
(45) Date of Patent: May 16, 2023

(54) MAGNETIC DOMAIN WALL MOVEMENT ELEMENT AND MAGNETIC RECORDING ARRAY

(71) Applicant: TDK CORPORATION, Tokyo (JP)

(72) Inventors: Takuya Ashida, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 212 days.

(21) Appl. No.: 17/039,244

(22) Filed: Sep. 30, 2020

(65) Prior Publication Data

US 2021/0098690 A1   Apr. 1, 2021

(30) Foreign Application Priority Data

Oct. 1, 2019   (JP) .............................. JP2019-181361

(51) Int. Cl.
*H10N 50/80*      (2023.01)
*G11C 11/16*      (2006.01)
*H10B 61/00*      (2023.01)

(52) U.S. Cl.
CPC ........... *H10N 50/80* (2023.02); *G11C 11/161* (2013.01); *H10B 61/22* (2023.02)

(58) Field of Classification Search
CPC ...... H01L 43/02; H01L 27/228; G11C 11/161
See application file for complete search history.

(56) References Cited

U.S. PATENT DOCUMENTS

2010/0193889 A1    8/2010   Nagahara et al.
2016/0284980 A1*   9/2016   Tonegawa ............... H01L 43/02

FOREIGN PATENT DOCUMENTS

JP        5472830 B2      4/2014
WO    2009/019949 A1     2/2009

* cited by examiner

*Primary Examiner* — Shih Tsun A Chou
(74) *Attorney, Agent, or Firm* — Oliff PLC

(57) ABSTRACT

A magnetic domain wall movement element includes a wiring layer containing a ferromagnetic material, a non-magnetic layer in contact with the first surface of the wiring layer, a first conductive layer connected to the first surface of the wiring layer and containing a ferromagnetic material; and a second conductive layer connected to the wiring layer at a distance from the first conductive layer. A first part of the connection face of the first conductive layer is directly connected to the wiring layer, and a second part of the connection face other than the first part is connected to the wiring layer via the non-magnetic layer.

21 Claims, 8 Drawing Sheets

MAGNETIC DOMAIN WALL MOVEMENT ELEMENT AND MAGNETIC RECORDING ARRAY

BACKGROUND OF THE INVENTION

Field of the Invention

The present invention relates to a magnetic domain wall movement element and a magnetic recording array. Priority is claimed on Japanese Patent Application No. 2019-181361, filed on Oct. 1, 2019, the contents of which are incorporated herein by reference.

Description of Related Art

Attention has been focused on next-generation non-volatile memories that will replace flash memories or the like for which the limit of miniaturization has been reached. For example, magnetoresistive random access memories (MRAMs), resistance random access memories (ReRAMs), phase change random access memories (PCRAMs), and the like are known as next-generation non-volatile memories.

In MRAMs, a change in resistance value caused due to change in magnetization direction is used for data recording. Data recording is carried out by each of the variable magnetoresistance elements constituting the MRAM. For example, Patent Document 1 describes a variable magnetoresistance elements (magnetic domain wall movement element) which can record multi-valued data by moving a magnetic domain wall in a magnetic recording layer. Patent Document 1 describes that an intermediate layer is provided between a magnetic coupling layer and a first magnetization fixing region. Further, it describes that the intermediate layer may be formed so as to be in contact with the entire magnetic recording layer, and the intermediate layer may be used as the base layer.

PATENT DOCUMENT

[Patent Document 1] PCT International Publication No. WO2009/019949

SUMMARY OF THE INVENTION

Since a magnetic domain wall movement element records data in a multi-valued or analog manner according to a position of the magnetic domain wall, it is necessary to maintain the magnetic domain wall in the magnetic recording layer. The magnetic domain wall is formed by twisting the direction of magnetization in the magnetic recording layer. For example, when ferromagnetic layers oriented in different directions are brought close to different positions of a magnetic recording layer to create different magnetic domains in the magnetic recording layer, the direction of magnetization is twisted in the magnetic recording layer and a magnetic domain wall is generated. If each magnetic domain is not sufficiently fixed, the moving range of the magnetic domain wall becomes wider than the desired range, and in some cases, the magnetic domain wall disappears. For example, the variable magnetoresistance elements shown in Patent Document 1 fixes the magnetization in the first magnetization fixed region by magnetic coupling. However, the magnetic coupling between the magnetic coupling layer and the first magnetization fixing region may not be sufficiently obtained, and the magnetic domain may be insufficiently fixed.

The present invention was made in view of the above-described problems and provides a magnetic domain wall movement element and a magnetic memory in which the movement of the magnetic domain wall is stable.

(1) A magnetic domain wall movement element according to a first aspect includes: a wiring layer containing a ferromagnetic material; a non-magnetic layer in contact with the first surface of the wiring layer; a first conductive layer connected to the first surface of the wiring layer and containing a ferromagnetic material; and a second conductive layer connected to the wiring layer at a distance from the first conductive layer, wherein a first part of the connection face of the first conductive layer is directly connected to the wiring layer, and a second part of the connection face other than the first part is connected to the wiring layer via the non-magnetic layer.

(2) In the magnetic domain wall movement element according to a second aspect includes: a wiring layer containing a ferromagnetic material; a non-magnetic layer in contact with the first surface of the wiring layer; a first conductive layer connected to the first surface of the wiring layer and containing a ferromagnetic material; and a second conductive layer connected to the wiring layer at a distance from the first conductive layer, wherein the first conductive layer is connected to the wiring layer via the non-magnetic layer; the thickness of the non-magnetic layer at a position located between the first conductive layer and the wiring layer is thinner than the thickness of the non-magnetic layer at a position which overlaps the first end of the connection face of the first conductive layer on the side near the second conductive layer in plan view.

(3) In the magnetic domain wall movement element according to the aspect, the area of the first part is wider than the area of the second part.

(4) In the magnetic domain wall movement element according to the aspect, the connection face of the first conductive layer is recessed in the lamination direction, and a part of the non-magnetic layer is fitted in the recess of the connection face.

(5) In the magnetic domain wall movement element according to the aspect, the first surface of the wiring layer is recessed in the lamination direction, and the non-magnetic layer is fitted in the recess of the connection face.

(6) In the magnetic domain wall movement element according to the aspect, the non-magnetic layer located between the first conductive layer and the wiring layer becomes thinner as it moves away from the first end of the connection face on the side near the second conductive layer.

(7) In the magnetic domain wall movement element according to the aspect, the average thickness of the non-magnetic layer between the first conductive layer and the wiring layer is 10 Å or less.

(8) In the magnetic domain wall movement element according to the aspect, the second conductive layer contains a ferromagnetic material and a first part of the connection face of the second conductive layer is directly connected to the wiring layer, and a second part of the connection face other than the first part is connected to the wiring layer via the non-magnetic layer.

(9) In the magnetic domain wall movement element according to the aspect, the second conductive layer contains a ferromagnetic material and the thickness of the non-magnetic layer at a position located between the second conductive layer and the wiring layer is thinner than the thickness of the non-magnetic layer at a position which overlaps the first end of the connection face of the second conductive layer on the side near the first conductive layer in plan view.

(10) The magnetic domain wall movement element according to the aspect, further includes: a ferromagnetic layer located above the second surface of the wiring layer opposite the first surface; and a second non-magnetic layer located between the ferromagnetic layer and the wiring layer.

(11) In the magnetic domain wall movement element according to the aspect, the non-magnetic layer has a thickness changing portion that becomes thinner as the distance from the ferromagnetic layer increases and the thickness changing portion does not overlap the ferromagnetic layer when viewed from the lamination direction.

(12) In the magnetic domain wall movement element according to the aspect, the non-magnetic layer has a thickness changing portion that becomes thinner as the distance from the ferromagnetic layer increases and a part of the thickness changing portion overlaps the ferromagnetic layer when viewed from the lamination direction.

(13) A magnetic recording array according to a third aspect may include: a plurality of the magnetic domain wall movement elements according to the aspect.

According to the magnetic domain wall movement element and the magnetic recording array according to the aspect, it is possible to stabilize the movement of the magnetic domain wall.

DETAILED DESCRIPTION OF THE INVENTION

Figure 1:
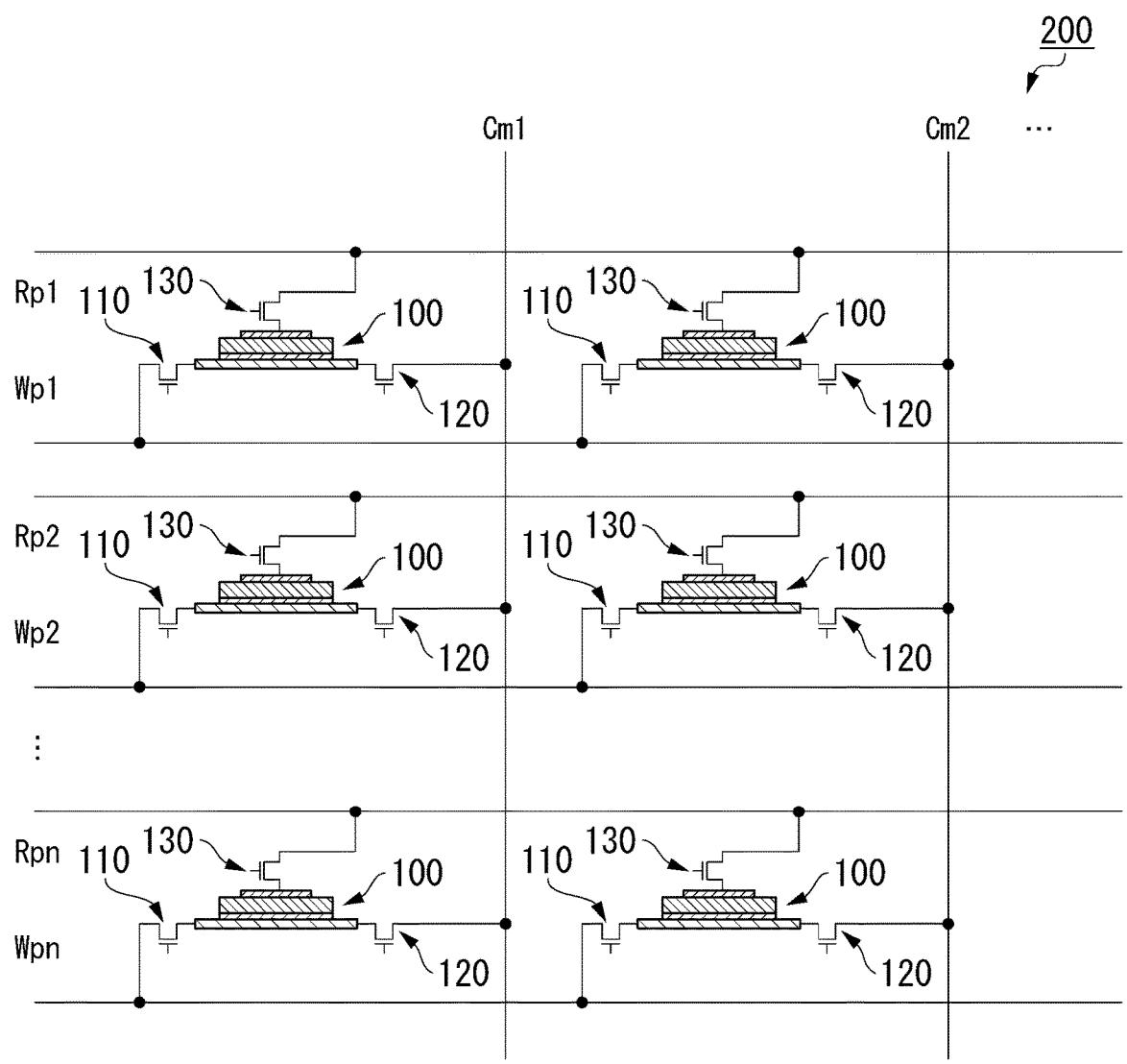
FIG. 1 is a constitution diagram of a magnetic recording array according to a first embodiment.

This embodiment will be described in detail below with reference to the drawings as appropriate. In the drawings used in the following description, in order to make the characteristics of the present invention easy to understand, for convenience, characteristic portions may be illustrated in an enlarged manner in some cases and dimensional ratios or the like of constituent elements may be different from actual dimensional ratios in some cases. The materials, dimensions, and the like exemplified in the following description are merely examples and the present invention is not limited thereto and it is possible to appropriately change and implement the present invention with a range in which the effects of the present invention can be obtained.

First, directions will be defined. An x direction and a y direction are directions substantially parallel to one surface of a substrate Sub (see FIG. 2) which will be described later. The x direction is a direction in which a wiring layer 10 which will be described later extends, and is also a direction from the first conductive layer 30 to the second conductive layer 40, which will be described later. The y direction is a direction orthogonal to the x direction. A z direction is a direction from the substrate Sub to the magnetic domain wall movement element 100, which will be described later. The z direction is an example of a lamination direction. Furthermore, the expression "extends in the x direction" in the specification means that, for example, a dimension in the x direction is larger than a minimum dimension among dimensions in the x direction, the y direction, and the z direction. The same applies to the case of extending in other directions.

First Embodiment

FIG. 1 is a constitution diagram of a magnetic recording array according to a first embodiment. The magnetic recording array 200 includes a plurality of first wirings Wp1 to Wp3, a plurality of second wirings Cm1 to Cm3, a plurality of third wirings Rp1 to Rp3, a plurality of first switching elements 110, a plurality of second switching elements 120, and a plurality of third switching elements 130. The magnetic recording array 200 can be used, for example, in a magnetic memory, a product-sum calculator, and a neuromorphic device.

<First Wiring, Second Wiring, Third Wiring>

The first wirings Wp1 to Wpn are write wirings. The first wirings Wp1 to Wpn electrically connect the power supply and one or more magnetic domain wall movement elements 100. The power supply is connected to one end of the magnetic recording array 200 during use.

The second wirings Cm1 to Cmn are common wirings. Each of the common wirings is a wiring used both at the time of writing data and at the time of reading data. The second wirings Cm1 to Cmn electrically connect a reference potential and one or more magnetic domain wall movement elements 100. The reference potential is, for example, ground. The second wirings Cm1 to Cmn may be provided in each of the plurality of magnetic domain wall movement elements 100 or may be provided over the plurality of magnetic domain wall movement elements 100.

The third wirings Rp1 to Rpn are read wirings. The third wirings Rp1 to Rpn electrically connect a power supply and one or more magnetic domain wall movement elements 100. The power supply is connected to one end of the magnetic recording array 200 during use.

<First Switching Element, Second Switching Element, and Third Switching Element>

The first switching element 110, the second switching element 120, and the third switching element 130 shown in FIG. 1 are connected to each of the plurality of magnetic domain wall movement elements 100. A device in which switching elements are connected to the magnetic domain wall movement elements 100 is called a semiconductor device. The first switching element 110 is connected between each of the magnetic domain wall movement elements 100 and the each of first wirings Wp1 to Wpn. The second switching element 120 is connected between each of the magnetic domain wall movement elements 100 and each of the second wirings Cm1 to Cmn. The third switching element 130 is connected between each of the magnetic domain wall movement elements 100 and each of the third wirings Rp1 to Rpn.

If the first switching element 110 and the second switching elements 120 are turned on, a write current flows between the first wirings Wp1 to Wpn and the second wirings Cm1 to Cmn connected to predetermined magnetic domain wall movement elements 100. If the first switching elements 110 and the third switching elements 130 are turned on, a read current flows between the first wirings Wp1 to Wpn and the third wirings Rp1 to Rpn connected to predetermined magnetic domain wall movement elements 100.

The first switching elements 110, the second switching elements 120, and the third switching elements 130 are elements configured to control a flow of a current. For example, as the first switching elements 110, the second switching elements 120, and the third switching elements 130, elements such as transistors and ovonic threshold switches (OTSs) in which a phase change of a crystal layer is used, elements such as a metal-insulator transition (MIT) switch in which a change in band structure is used, elements such as Zener diodes and avalanche diodes in which a breakdown voltage is used, elements in which conductivity changes with a change in atomic position, and the like can be utilized.

Any one of the first switching element 110, the second switching element 120, and the third switching element 130 may be shared by the magnetic domain wall movement elements 100 connected to the same wiring. For example, when the first switching element 110 is shared, one first switching element 110 is provided upstream of the first wirings Wp1 to Wpn. For example, when the second switching element 120 is shared, one second switching element 120 is provided upstream of the second wirings Cm1 to Cmn. For example, when the third switching element 130 is shared, one third switching element 130 is provided upstream of the third wirings Rp1 to Rpn.

Figure 2:
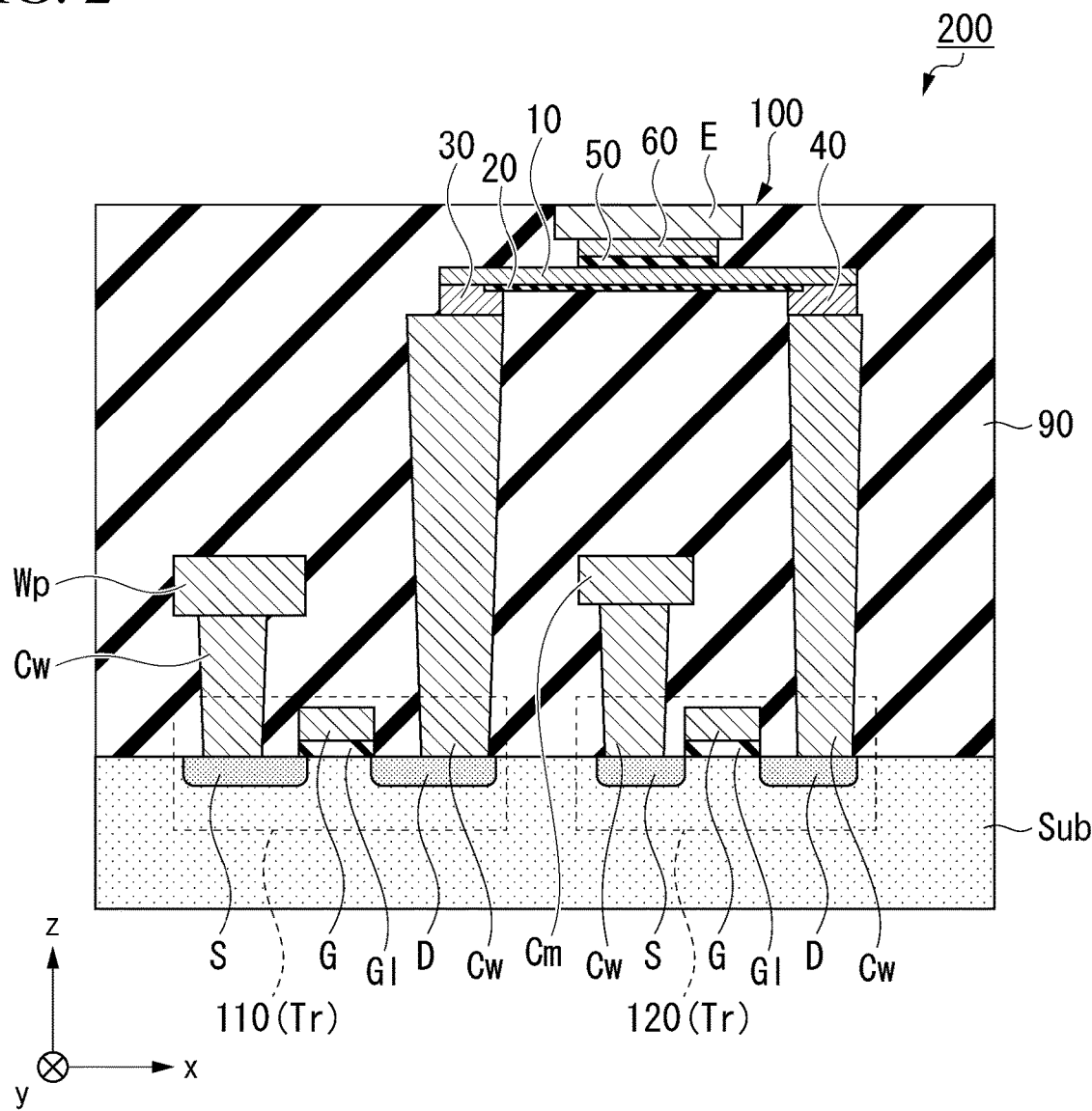
FIG. 2 is a cross-sectional view of a main part of the magnetic recording array according to the first embodiment.

FIG. 2 is a cross-sectional view of a main part of the magnetic recording array according to the first embodiment. FIG. 2 is a cross section of one magnetic domain wall movement element 100 in FIG. 1 cut in an xz plane passing through the center of the width of the wiring layer 10 in the y direction.

The first switching element 110 and the second switching element 120 shown in FIG. 2 are transistors Tr. The transistor Tr has a gate electrode G, a gate insulating film GI, and a source region S and a drain region D formed on a substrate Sub. The substrate Sub is, for example, a semiconductor substrate. The third switching element 130 is electrically connected to the electrode E and is located, for example, in the depth direction (−y direction) of the paper surface.

Each of the transistors Tr and the magnetic domain wall movement element 100 are electrically connected to each other via the connection wiring Cw. The connection wiring Cw contains a material having conductivity. The connection wiring Cw extends, for example, in the z direction. The connection wiring Cw is, for example, a via wiring formed in the opening of the insulating layer 90.

The magnetic domain wall movement element 100 and the transistor Tr are electrically separated by an insulating layer 90 except for the connection wiring Cw. The insulating layer 90 is an insulating layer that insulates between the wirings of the multilayer wiring and between the elements. The insulating layer 90 is made of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), and the like.

<Magnetic Domain Wall Movement Element>

Figure 3:
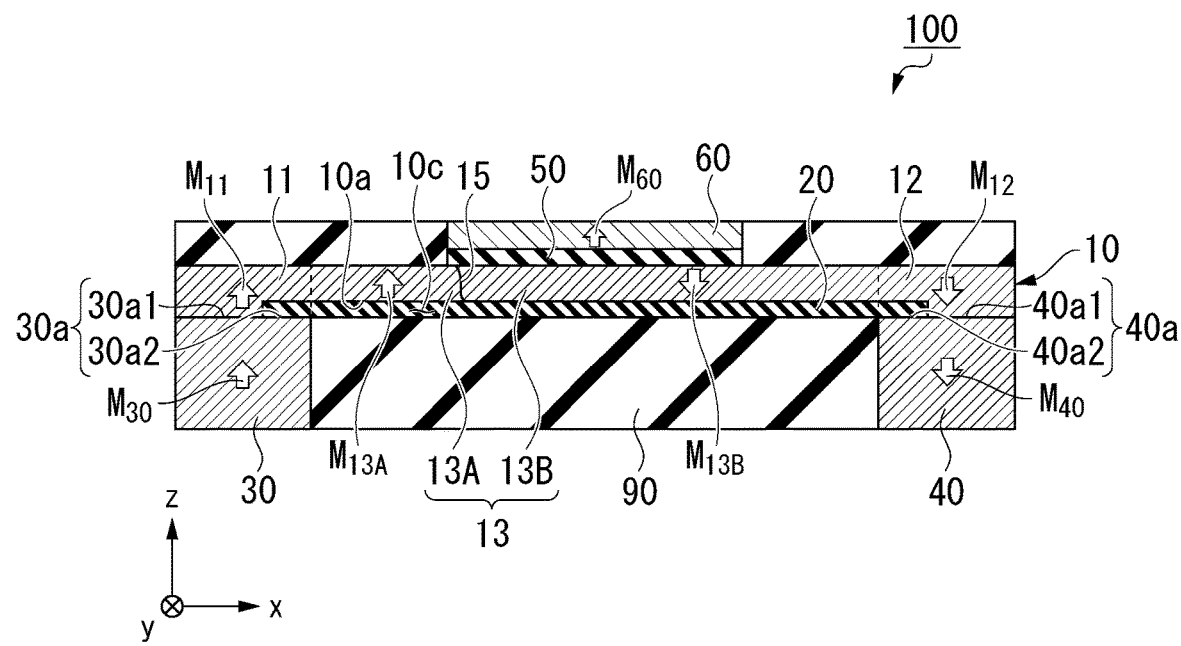
FIG. 3 is a cross-sectional view of a magnetic domain wall movement element according to the first embodiment.

FIG. 3 is a cross-sectional view of the magnetic domain wall movement element 100 cut in an xz plane passing through the center of the width of the wiring layer 10 in the y direction. The magnetic domain wall movement element 100 includes a wiring layer 10, a non-magnetic layer 20, a first conductive layer 30, a second conductive layer 40, a second non-magnetic layer 50, and a ferromagnetic layer 60. When writing data to the magnetic domain wall movement element 100, a write current is passed through the wiring layer 10 between the first conductive layer 30 and the second conductive layer 40. When reading data from magnetic domain wall movement element 100, a read current is passed between the first conductive layer 30 or the second conductive layer 40 and the ferromagnetic layer 60.

<Wiring Layer>

The wiring layer 10 is a portion extending in the x direction and is a portion to which a write current is applied. The wiring layer 10 is, for example, a rectangle having a long axis in the x direction and a short axis in the y direction in a plan view from the z direction. The wiring layer 10 is connected to the first conductive layer 30 and the second conductive layer 40. Hereinafter, the surface of the wiring layer 10 on the side to which the first conductive layer 30 is connected is referred to as a first surface 10a. The write current flows along the wiring layer 10 from the first conductive layer 30 toward the second conductive layer 40, or from the second conductive layer 40 toward the first conductive layer 30. The wiring layer 10 is laminated on the non-magnetic layer 20, the first conductive layer 30, and the second conductive layer 40.

The wiring layer 10 is a layer capable of magnetically recording information by changing the internal magnetic state. The wiring layer 10 may be called a magnetic recording layer or a magnetic domain wall movement layer.

The wiring layer 10 includes fixed magnetization regions 11, 12 and a magnetic domain wall movement region 13. The magnetic domain wall movement region 13 is sandwiched between two fixed magnetization regions 11 and 12.

The fixed magnetization region 11 is a region in which the wiring layer 10 overlaps with the connection face 30a of the first conductive layer 30 when viewed from the z direction. The fixed magnetization region 12 is a region in which the wiring layer 10 overlaps with the connection face 40a of the second conductive layer 40 when viewed from the z direction. The magnetizations M11 and M12 in the fixed magnetization regions 11 and 12 are harder to be reversed than the magnetizations M13A and M13B in the magnetic domain wall movement region 13, and are not reversed even if an external force with a threshold value for reversing the magnetizations M13A and M13B is applied to the magnetizations M11 and M12. Therefore, it is said that that the magnetizations M11 and M12 of the magnetization fixing regions 11 and 12 are fixed to the magnetizations M13A and M13B of the magnetic domain wall movement region 13.

The magnetization M11 in the fixed magnetization region 11 and the magnetization M12 in the fixed magnetization region 12 are oriented in different directions. The magnetization M11 in the fixed magnetization region 11 and the magnetization M12 in the fixed magnetization region 12 are oriented, for example, in opposite directions. The magnetization M11 in the fixed magnetization region 11 is oriented, for example, in the +z direction and the magnetization M12 in the fixed magnetization region 12 is oriented, for example, in the −z direction.

The magnetic domain wall movement region 13 is composed of a first magnetic domain 13A and a second magnetic domain 13B. The first magnetic domain 13A is adjacent to the fixed magnetization region 11. The magnetization M13A of the first magnetic domain 13A is influenced by the magnetization M11 of the fixed magnetization region 11, and is oriented, for example, in the same direction as the magnetization M11 of the fixed magnetization region 11. The second magnetic domain 13B is adjacent to the fixed magnetization region 12. The magnetization M13B of the second magnetic domain 13B is influenced by the magnetization M12 of the fixed magnetization region 12, and is oriented, for example, in the same direction as the magnetization M12 of the fixed magnetization region. Therefore, the magnetization M13A of the first magnetic domain 13A and the magnetization M13B of the second magnetic domain 13B are oriented in different directions. The magnetization M13A of the first magnetic domain 13A and the magnetization M13B of the second magnetic domain 13B are oriented, for example, in opposite directions.

The boundary between the first magnetic domain 13A and the second magnetic domain 13B is the magnetic domain wall 15. The magnetic domain wall 15 moves within the magnetic domain wall movement region 13. In principle, the magnetic domain wall 15 does not penetrate into the fixed magnetization regions 11 and 12.

When the ratio of the first magnetic domain 13A and the second magnetic domain 13B in the magnetic domain wall movement region 13 changes, the magnetic domain wall 15 moves. The magnetic domain wall 15 moves by passing a write current in the x direction of the magnetic domain wall movement region 13. For example, when a write current (for example, a current pulse) in the +x direction is applied to the magnetic domain wall movement region 13, electrons flow in the −x direction opposite to the current, so that the magnetic domain wall 15 moves in the −x direction. When a current flows from the first magnetic domain 13A to the second magnetic domain 13B, the spin-polarized electrons in the second magnetic domain 13B reverse the magnetization M13A of the first magnetic domain 13A. When the magnetization M13A in the first magnetic domain 13A is reversed, the magnetic domain wall 15 moves in the −x direction.

The wiring layer 10 is made of a magnetic material. It is desirable that the wiring layer 10 include at least one element selected from the group consisting of Co, Ni, Fe, Pt, Pd, Gd, Tb, Mn, Ge, and Ga. Examples of the material used for the magnetic recording layer 20 include a laminated film made of Co and Ni, a laminated film made of Co and Pt, a laminated film made of Co and Pd, a MnGa-based material, a GdCo-based material, and a TbCo-based material. Ferrimagnetic materials such as a MnGa-based material, a GdCo-based material, and a TbCo-based material have a small saturation magnetization and a small threshold value current for moving a magnetic domain wall. Furthermore, a laminated film made of Co and Ni, a laminated film made of Co and Pt, and a laminated film made of Co and Pd have a large coercivity and a slow moving speed of a magnetic domain wall.

<Non-Magnetic Layer>

The non-magnetic layer 20 is in contact with the first surface 10a of the wiring layer 10. The non-magnetic layer 20 is on the first surface 10a of the wiring layer 10. The non-magnetic layer 20 shown in FIG. 3 fits into the recess 10c formed on the first surface 10a. The non-magnetic layer 20 shown in FIG. 3 straddles a part of the fixed magnetization region 11, the magnetic domain wall movement 13, and a part of the fixed magnetization region 12.

The non-magnetic layer 20 extends from a position overlapping the magnetic domain wall movement 13 in the z direction toward between the fixed magnetization region 11 and the first conductive layer 30 and between the fixed magnetization region 12 and the second conductive layer 40. The first end of the non-magnetic layer 20 is between the fixed magnetization region 11 and the first conductive layer 30. The second end of the non-magnetic layer 20 is between the fixed magnetization region 12 and the second conductive layer 40.

The non-magnetic layer 20 is made of a non-magnetic material. The non-magnetic layer 20 defines, for example, the crystal structure of the wiring layer 10. The crystal structure of the non-magnetic layer 20 enhances the crystallinity of the wiring layer 10 and enhances the orientation of the magnetization of the wiring layer 10. The crystal structure of the non-magnetic layer 20 is, for example, amorphous, (001) oriented NaCl structure, (002) oriented perovskite structure represented by the composition formula of $ABO_3$, or (001) oriented tetragonal structure or cubic structure.

The non-magnetic layer 20 is a conductor or an insulator. The non-magnetic layer 20 is preferably a conductor. When the non-magnetic layer 20 is a conductor, the thickness of the non-magnetic layer 20 is preferably thinner than the thickness of the wiring layer 10. The non-magnetic layer 20 contains, for example, Ta, Ru, Pt, Ir, Rh, W, Pd, Cu, Au, and Cu. The non-magnetic layer 20 is, for example, a Ta layer, a Pt layer, or a laminate of a Ta layer and a Pt layer.

The thickness of the non-magnetic layer 20 is, for example, substantially constant in the xy plane. The average thickness of the non-magnetic layer 20 is, for example, 50 Å or less. The average thickness is the average value of the thicknesses of the non-magnetic layers 20 measured at the positions in the x directions of dividing the non-magnetic layer 20 into 10 at equal intervals in the x direction.

<First Conductive Layer and Second Conductive Layer>

The first conductive layer 30 is connected to the first surface 10a of the wiring layer 10. The second conductive layer 40 is connected to, for example, the first surface 10a of the wiring layer 10. The second conductive layer 40 may be connected to a surface other than the first surface 10a of the wiring layer 10. The second conductive layer 40 is separated from the first conductive layer 30 and is connected to the wiring layer 10. The first conductive layer 30 is connected to, for example, the first end of the wiring layer 10, and the second conductive layer 40 is connected to, for example, the second end of the wiring layer 10. The first conductive layer 30 and the second conductive layer 40 are, for example, connecting portions between the connecting wiring Cw and the wiring layer 10.

The first conductive layer 30 contains a magnetic material. The magnetization M30 of the first conductive layer 30 is oriented in one direction. The magnetization M30 is oriented, for example, in the +z direction. The first conductive layer 30 fixes the magnetization M11 in the fixed magnetization region 11. The magnetization M30 of the first conductive layer 30 and the magnetization M11 of the fixed magnetization region 11 are oriented, for example, in the same direction.

The first conductive layer 30 contains, for example, a metal selected from the group consisting of Cr, Mn, Co, Fe and Ni, or an alloy containing at least one of these metals, or an alloy containing at least one of these metals and at least one of B, C, and N. The first conductive layer 30 is made of, for example, Co—Fe, Co—Fe—B, Ni—Fe, or the like. When an easy magnetization axis of the first conductive layer 30 is in the z direction (perpendicular magnetization film), the first conductive layer 30 is preferably a laminate of a ferromagnetic material selected from the group consisting of Co, Fe and Ni and a non-magnetic material selected from the group consisting of Pt, Pd, Ru and Rh. Further, the first conductive layer 30 may have a synthetic antiferromagnetic structure (an SAF structure). The synthetic antiferromagnetic structure is composed of two magnetic layers having a non-magnetic layer disposed therebetween. Magnetization of each of the two magnetic layers is fixed, and directions of the fixed magnetization are opposite.

The second conductive layer 40 is made of a conductive material. The second conductive layer 40 contains a magnetic material. When the second conductive layer 40 contains a magnetic material, the magnetization M40 of the second conductive layer 40 is oriented in a direction different from the magnetization M30 of the first conductive layer 30. The magnetization M40 is oriented, for example, in the −z direction. In this case, the second conductive layer 40 fixes the magnetization M12 in the fixed magnetization region 12, and the magnetization M40 in the second conductive layer 40 and the magnetization M12 in the fixed magnetization region 12 are oriented, for example, in the same direction. The second conductive layer 40 may be made of, for example, the same material as the first conductive layer 30. When the second conductive layer 40 does not contain a magnetic material, the magnetization M12 in the fixed magnetization region 12 is fixed by, for example, an external magnetic field.

Figure 4:
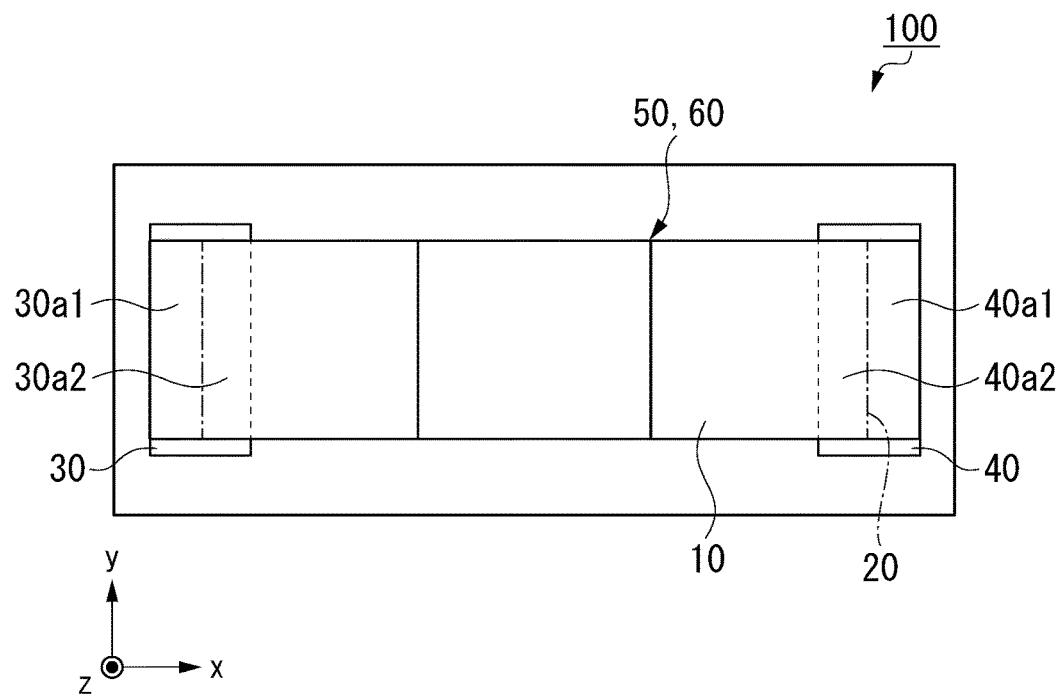
FIG. 4 is a plan view of the magnetic domain wall movement element according to the first embodiment.

A part of the first conductive layer 30 is in direct contact with the wiring layer 10, and a part of the first conductive layer 30 is in contact with the wiring layer 10 via the non-magnetic layer 20. The connection face (surface) 30a of the first conductive layer 30 is partially in contact with the wiring layer 10 and partly in contact with the non-magnetic layer 20. Hereinafter, a part of the connection face 30a that is in direct contact with the wiring layer 10 is referred to as a first part 30a1, and a part of the connection face 30a that is in contact with the wiring layer 10 via the non-magnetic layer 20 is referred to as a second part 30a2. As shown in FIG. 4, for example, the area of the first part 30a1 is larger than the area of the second part 30a2. FIG. 4 is a plan view of the magnetic domain wall movement element according to the first embodiment.

A part of the second conductive layer 40 shown in FIGS. 3 and 4 is in direct contact with the wiring layer 10, and a part of the second conductive layer 40 is in contact with the wiring layer 10 via the non-magnetic layer 20. The connection face (surface) 40a of the second conductive layer 40 is partially in contact with the wiring layer 10 and partly in contact with the non-magnetic layer 20. Hereinafter, a part of the connection face 40a that is in direct contact with the wiring layer 10 is referred to as a first part 40a1, and a part of the connection face 40a that is in contact with the wiring layer 10 via the non-magnetic layer 20 is referred to as a second part 40a2. As shown in FIG. 4, for example, the area of the first part 40a1 is larger than the area of the second part 40a2.

<Second Non-Magnetic Layer>

The second non-magnetic layer 50 is located between the wiring layer 10 and the ferromagnetic layer 60. The second non-magnetic layer 50 is laminated on the second surface of the wiring layer 10. The second surface is a surface facing the first surface 10a.

The second non-magnetic layer 50 is made of, for example, a non-magnetic insulator, a semiconductor or a metal. The non-magnetic insulator is, for example, $Al_2O_3$, $SiO_2$, MgO, $MgAl_2O_4$, and a material in which Al, Si, and Mg are partly replaced with Zn, Be, and the like. These materials have a large bandgap and are excellent in insulating properties. When the second non-magnetic layer 50 is made of a non-magnetic insulator, the second non-magnetic layer 50 is a tunnel barrier layer. The non-magnetic metal is, for example, Cu, Au, Ag or the like. Non-magnetic semiconductors are, for example, Si, Ge, $CuInSe_2$, $CuGaSe_2$, Cu(In, Ga)$Se_e$ and the like.

The thickness of the second non-magnetic layer 50 is preferably 20 Å or more, and more preferably 30 Å or more. When the thickness of the second non-magnetic layer 50 is large, the resistance area product (RA) of the magnetic domain wall movement element 100 becomes large. The resistance area product (RA) of the magnetic domain wall movement element 100 is preferably $1 \times 10^4$ $\Omega$ $\mu m^2$ or more, and more preferably $1 \times 10^5$ $\Omega$ $\mu m^2$ or more. The resistance area product (RA) of the magnetic domain wall movement element 100 is represented by the product of the element resistance of one magnetic domain wall movement element 100 and the element cross-sectional area of the magnetic domain wall movement element 100 (the area of the cut surface obtained by cutting the second non-magnetic layer 50 in the xy plane).

The ferromagnetic layer 60 is on the second non-magnetic layer 50. The ferromagnetic layer 60 has a unidirectionally oriented magnetization M60. The magnetization M60 of the ferromagnetic layer 60 is less likely to be reversed than the magnetizations M13A and M13B of the magnetic domain wall movement region 13 when a predetermined external force is applied. The predetermined external force is, for example, an external force applied to the magnetization by an external magnetic field or an external force applied to the magnetization by a spin polarization current. The ferromagnetic layer 60 is sometimes called a fixed magnetization layer or a magnetization reference layer.

The resistance value of the magnetic domain wall movement element 100 changes depending on a difference in relative angle between the magnetization of the ferromagnetic layer 60 and the magnetizations M13A and M13B of the magnetic domain wall movement region 13. The magnetization M13A of the first magnetic domain 13A is, for example, in the same direction (parallel) as the magnetization M60 of the ferromagnetic layer 60, and the magnetization M13B of the second magnetic domain 13B is, for example, in the opposite direction (antiparallel) to the magnetization M60 of the ferromagnetic layer 60. When the area of the first magnetic domain 13A overlapping with the ferromagnetic layer 60 in plan view from the z direction becomes large, the resistance value of the magnetic domain wall movement element 100 becomes low. On the contrary, when the area of the second magnetic domain 13B overlapping with the ferromagnetic layer 60 in plan view from the z direction becomes large, the resistance value of the magnetic domain wall movement 100 becomes high.

The ferromagnetic layer 60 includes a ferromagnetic material. The ferromagnetic layer 60 includes, for example, a material that easily obtains a coherent tunnel effect with the wiring layer 10. The ferromagnetic layer 60 includes, for example, a metal selected from the group consisting of Cr, Mn, Co, Fe, and Ni, an alloy containing at least one metal of these metals, an alloy containing at least one of these metals and at least one of B, C, and N or the like. The ferromagnetic layer 60 is made of, for example, Co—Fe, Co—Fe—B, or Ni—Fe.

The ferromagnetic layer 60 may be a, for example, Heusler alloy. The Heusler alloy is a half-metal and has a high spin polarization. The Heusler alloy is an intermetallic compound having a chemical composition of XYZ or $X_2YZ$. X represents a Co-, Fe-, Ni-, or Cu-group transition metal element or a noble metal element in the periodic table, Y represents a Mn-, V-, Cr-, or Ti-group transition metal or an element of the X type in the periodic table, and Z represents a typical element from Group III to Group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

A film thickness of the ferromagnetic layer 60 is preferably 1.5 nm or less, and is more preferably 1.0 nm or less when an easy magnetization axis of the ferromagnetic layer 60 is assumed to a z direction (a perpendicular magnetization film is assumed). If the film thickness of the ferromagnetic layer 60 is reduced, perpendicular magnetic anisotropy (interface perpendicular magnetic anisotropy) can be added to the ferromagnetic layer 60 at an interface between the ferromagnetic layer 60 and another layer (the second non-magnetic layer 50), and the magnetization of the ferromagnetic layer 60 is easily oriented in the z direction.

When an easy magnetization axis of the ferromagnetic layer 60 is in the z direction, it is preferable that the ferromagnetic layer 60 be a laminate of a ferromagnetic material selected from the group consisting of Co, Fe, and Ni and a non-magnetic material selected from the group consisting of Pt, Pd, Ru, and Rh, and it is more preferable to insert a non-magnetic material selected from the group consisting of Ir and Ru as an intermediate layer at any position in the laminate. If a ferromagnetic material and a non-magnetic material are laminated, it is possible to add perpendicular magnetic anisotropy and when the intermediate layer is inserted, it is possible to more strongly fix the magnetization of the ferromagnetic layer 60 in z direction.

An antiferromagnetic layer may be provided on the surface of the ferromagnetic layer 60 opposite to the second non-magnetic layer 50 via a spacer layer. The ferromagnetic layer 60, the spacer layer, and the antiferromagnetic layer have a synthetic antiferromagnetic structure (a SAF structure). The synthetic antiferromagnetic structure consists of two magnetic layers sandwiching a non-magnetic layer. The antiferromagnetic coupling between the ferromagnetic layer 60 and the antiferromagnetic layer increases the coercive force of the ferromagnetic layer 60 as compared with the case where the antiferromagnetic layer is not provided. The antiferromagnetic layer is, for example, IrMn, PtMn, or the like. The spacer layer contains, for example, at least one selected from the group consisting of Ru, Ir, and Rh.

The direction of magnetization of each layer of the magnetic domain wall movement element 100 can be confirmed, for example, by measuring the magnetization curve. The magnetization curve can be measured using, for example, MOKE (Magneto Optical Kerr Effect). The measurement by MOKE is a measurement method performed by making linearly polarized light incident on an object to be measured and using a magneto-optical effect (magnetic Kerr effect) in which rotation in the polarization direction and the like occurs.

Next, a method of manufacturing the magnetic recording array 200 will be described. The magnetic recording array 200 is manufactured by a laminating step of each layer and a processing step of processing a part of each layer into a predetermined shape. For the lamination of each layer, a sputtering method, a chemical vapor deposition (CVD) method, an electron beam vapor deposition method (an EB vapor deposition method), an atomic laser deposition method, or the like can be used. The processing of each layer can be performed by using photolithography or the like.

First, impurities are doped at a predetermined position on the substrate Sub to form a source region S and a drain region D. Next, a gate insulating film GI and a gate electrode G are formed between the source region S and the drain region D. The source region S, drain region D, gate insulating film GI, and gate electrode G serve as transistors Tr.

Next, the insulating layer 90 is formed so as to cover the transistor Tr. Further, the connection wiring Cw is formed by forming an opening in the insulating layer 90 and filling the opening with a conductor. The first wiring Wp and the second wiring Cm are formed by laminating the insulating layer 90 to a predetermined thickness, forming a groove in the insulating layer 90, and filling the groove with a conductor.

The first conductive layer 30 and the second conductive layer 40 can be formed, for example, by laminating a ferromagnetic layer, a non-magnetic layer, and a ferromagnetic layer in this order on one surface of the insulating layer 90 and the connection wiring Cw, and by removing a portion other than the portion that becomes the first conductive layer 30 and the conductive layer 40. The removed portion is filled with, for example, an insulating layer 90.

Next, the non-magnetic layer 20 is laminated on the first conductive layer 30, the second conductive layer 40, and the insulating layer 90. A resist is formed on a part of the non-magnetic layer 20. The resist is formed so as to straddle a part of the fixed magnetization region 11, the magnetic domain wall movement region 13, and the fixed magnetization region 12. Next, the non-magnetic layer 20 is processed via the resist. For example, the non-magnetic layer 20 and the resist are irradiated with an ion beam. The portion of the non-magnetic layer 20 that is not coated with the resist is removed.

Next, the wiring layer 10, the second non-magnetic layer 50, and the ferromagnetic layer 60 are laminated in this order. After that, the second non-magnetic layer 50 and the ferromagnetic layer 60 are processed into a predetermined shape to obtain the magnetic domain wall movement element 100 shown in FIGS. 3 and 4.

According to the magnetic domain wall movement element 100 according to the first embodiment, the operation of the magnetic domain wall 15 in the wiring layer 10 can be stabilized. The operation of the magnetic domain wall 15 is, for example, the operating range of the magnetic domain wall 15, and is, for example, the ease of movement of the magnetic domain wall 15. When the controllability of the domain wall 15 is improved, malfunctions such as erroneous writing can be prevented, and the reliability of the magnetic domain wall movement element 100 is improved.

Figure 5:
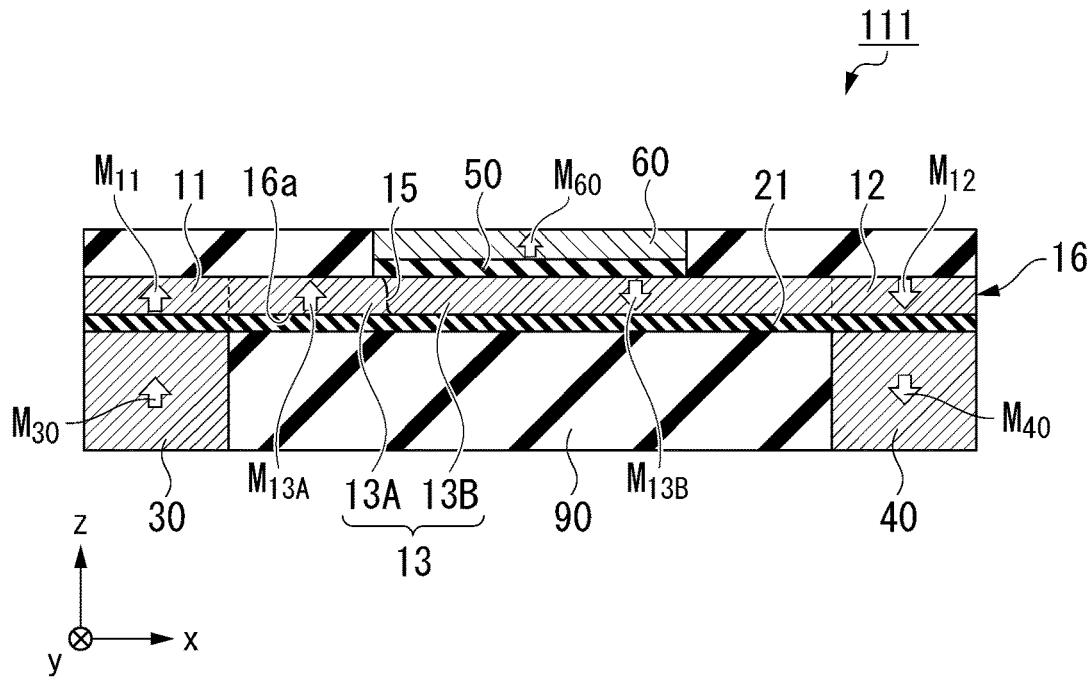
FIG. 5 is a cross-sectional view of a magnetic domain wall movement element according to a first comparative example.

FIG. 5 is a cross-sectional view of the magnetic domain wall movement element 111 according to the first comparative example cut in the xz plane passing through the center of the wiring layer 16 in y direction. The magnetic domain wall movement element 111 differs from the magnetic domain wall movement element 100 in that the first surface 16a of the wiring layer 16 is flat and the non-magnetic layer 21 is on the entire surface of the first surface 16a of the wiring layer 16. The wiring layer 16 corresponds to the wiring layer 10 described above, and the non-magnetic layer 21 corresponds to the non-magnetic layer 20 described above. The same components as those of the magnetic domain wall movement element 100 in the magnetic domain wall movement element 111 are designated by the same reference numerals, and the description thereof will be omitted.

In the magnetic domain wall movement element 111, there is a non-magnetic layer 21 between the fixed magnetization region 11 and the first conductive layer 30. That is, the magnetization M11 of the fixed magnetization region 11 is fixed by magnetic coupling with the magnetization M30 of the first conductive layer 30. The magnetic coupling via the non-magnetic layer 21 is weaker than the magnetic coupling when the fixed magnetization region 11 and the first conductive layer 30 are in direct contact with each other. Therefore, when an unexpected overcurrent flows between the first conductive layer 30 and the second conductive layer 40, or an unexpected heat is applied to the magnetic domain wall movement element 111, the magnetization M11 of the fixed magnetization region 11 may become reversed. When the magnetization M11 in the fixed magnetization region 11 is reversed, the magnetic domain wall 15 invades the fixed magnetization regions 11 and 12. In some cases, the magnetic domain wall 15 disappears. The invasion of the magnetic domain wall 15 into the fixed magnetization regions 11 and 12 and the disappearance of the magnetic domain wall 15 cause malfunctions such as erroneous writing, not the planned operation of the magnetic domain wall movement element 111.

On the other hand, in the magnetic domain wall movement element 100 according to the first embodiment, the first conductive layer 30 and the wiring layer 10, and the second conductive layer 40 and the wiring layer 10 are in direct contact with each other in the first portions 30a1 and 40a1. Therefore, the magnetization M11 in the fixed magnetization region 11 has a strong magnetic bond with the magnetization M30 of the first conductive layer 30, and the magnetization M11 is strongly fixed. That is, the invasion of the magnetic domain wall 15 into the fixed magnetization regions 11 and 12 and the disappearance of the domain wall 15 are suppressed, and the operation of the magnetic domain wall movement element 100 is stabilized.

Further, when the area of the first portions 30a1 and 40a1 is larger than the area of the second portions 30a2 and 40a2, the fixation of the magnetization of the fixed magnetization regions 11 and 12 becomes stronger. As a result, even when heat or the like is applied, it is possible to prevent the magnetic domain wall 15 from invading the fixed magnetization regions 11 and 12 and the magnetic domain wall 15 from disappearing.

Figure 6:
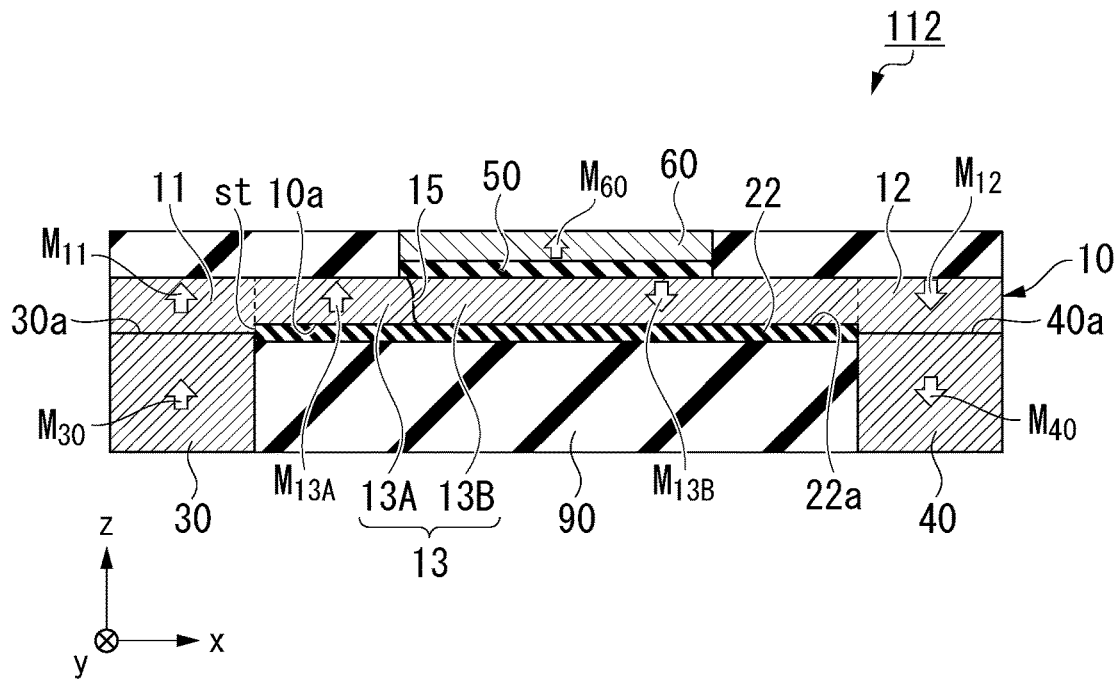
FIG. 6 is a cross-sectional view of a magnetic domain wall movement element according to a second comparative example.

Further, FIG. 6 is a cross-sectional view of the magnetic domain wall movement element 112 according to the second comparative example cut in the xz plane passing through the center of the wiring layer 10 in the y direction. The magnetic domain wall movement element 112 differs from the magnetic domain wall movement element 100 in that the non-magnetic layer 22 is located only at a position where the non-magnetic layer 22 overlaps the magnetic domain wall movement region 13 of the wiring layer 10. The same components as those of the magnetic domain wall movement element 100 in the magnetic domain wall movement element 111 are designated by the same reference numerals, and the description thereof will be omitted.

When the magnetic domain wall movement element 112 is manufactured, the wiring layer 10 is laminated on the first conductive layer 30, the non-magnetic layer 22, and the second conductive layer 40. Since the non-magnetic layer 22, the first conductive layer 30, and the second conductive layer 40 are made of different materials, the connection surfaces 22a of the non-magnetic layer 22 and the connection surfaces 30a and 40a of the first conductive layer 30 and the second conductive layer 40 are difficult to be continuous. Therefore, a step st is formed between the non-magnetic layer 22 and the first conductive layer 30 and between the non-magnetic layer 22 and the second conductive layer 40. Since the magnetization is affected by the interface, the orientation direction of the magnetization is disturbed in the vicinity of the step st. In the portion where the orientation direction of the magnetization is disturbed, the operation of the domain wall 15 becomes unstable and is trapped.

The boundary between the fixed magnetization regions 11 and 12 and the magnetic domain wall movement region 13 is a portion where the magnetic environment by which the magnetic domain wall 15 is received is different and where the magnetic domain wall 15 is easily trapped. If there is a trap factor of the structural magnetic domain wall 15, that is, a step st, in this portion, the magnetic domain wall 15 may be strongly trapped. If the magnetic domain wall 15 is strongly trapped, the magnetic domain wall 15 does not operate normally even if a current having a predetermined current density is applied to the wiring layer 10.

On the other hand, in the magnetic domain wall movement element 100 according to the first embodiment, the non-magnetic layer 20 straddles a part of the fixed magnetization region 11, the magnetic domain wall movement region 13, and a part of the fixed magnetization region 12. Therefore, the step st is not formed at the boundary between the fixed magnetization regions 11 and 12 and the magnetic domain wall movement region 13. Therefore, the strong trapping of the magnetic domain wall 15 is suppressed, and the operation of the magnetic domain wall movement element 100 is stabilized.

Although an example of the magnetic recording array 200 and the magnetic domain wall movement element 100 according to the first embodiment have been described in detail, the magnetic recording array 200 and the magnetic domain wall movement element 100 according to the first embodiment can be transformed or changed within the scope of the gist of the present invention.

For example, in FIGS. 3 and 4, the second conductive layer 40 and the wiring layer 10 are partly in direct contact with each other and partly in contact with the wiring layer 10 via the non-magnetic layer 20. The relationship between the second conductive layer 40 and the wiring layer 10 is not limited to this case, and the second conductive layer 40 and the wiring layer 10 may be in direct contact with each other on the entire surface, or the entire surface may be connected via the non-magnetic layer 20.

First Modified Example

Figure 7:
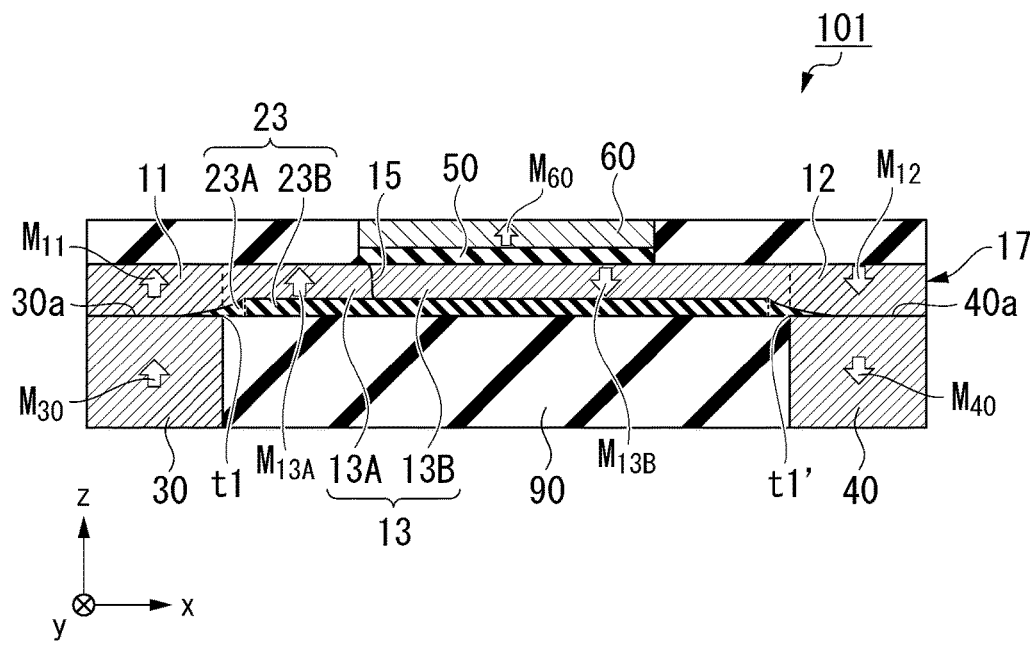
FIG. 7 is a cross-sectional view of a magnetic domain wall movement element according to a first modified example.

FIG. 7 is a cross-sectional view of the magnetic domain wall movement element 101 according to the first modified example on the yz plane. The shapes of the wiring layer 17 and the non-magnetic layer 23 of the magnetic domain wall movement element 101 are different from those of the magnetic domain wall movement element 100. The wiring layer 17 corresponds to the wiring layer 10 described above, and the non-magnetic layer 23 corresponds to the non-magnetic layer 20 described above. The same components as those of the magnetic domain wall movement element 100 in the magnetic domain wall movement element 101 are designated by the same reference numerals, and the description thereof will be omitted.

The non-magnetic layer 23 is different from the non-magnetic layer 20 in that it has a thickness changing portion 23A. Other characteristic configurations are the same as those of the non-magnetic layer 20. The non-magnetic layer 23 has a thickness changing portion 23A in which the thickness gradually decreases and a main portion 23B in which the thickness is substantially constant. The thickness of the thickness changing portion 23A becomes thinner as the distance from the midpoint in the x direction of the non-magnetic layer 23 increases. The thickness of the thickness changing portion 23A becomes thinner, for example, as the distance from the ferromagnetic layer 60 increases.

The thickness changing portion 23A is located at a position that does not overlap with the ferromagnetic layer 60 when viewed from the z direction. The non-magnetic layer 23 becomes thinner, for example, between the first conductive layer 30 and the wiring layer 10, as it is separated from the first end t1 on the side of the connection surface 30a closer to the second conductive layer 40. Further, the non-magnetic layer 23 becomes thinner, for example, between the second conductive layer 40 and the wiring layer 10, as the distance from the first end t1' on the side of the connection surface 40a closer to the first conductive layer 30.

The orientation direction of the magnetization of the wiring layer 10 is strongly influenced by the shape of the interface with other layers. The magnetization of the wiring layer 17 on the thickness changing portion 23A is inclined, for example, from the z direction to the y direction. When the thickness of the thickness changing portion 23A is gradually reduced, the inclination angle of the magnetization of the wiring layer 17 on the thickness changing portion 23A gradually changes depending on the position in the x direction. By gradually changing the inclination angle of the magnetization, the initial motion of the magnetic domain wall 15 becomes easy, and the reversal current density required for reversing the magnetization of the wiring layer 10 can be reduced.

Further, the main portion 23B is at a position where it overlaps with the ferromagnetic layer 60 when viewed from the z direction, and the thickness changing portion 23A is at a position where it does not overlap with the ferromagnetic layer 60 when viewed from the z direction. If the main portion 23B is located at a position overlapping the ferromagnetic layer 60, the resistance change rate (MR ratio) of the magnetic domain wall movement element 100 increases. The MR ratio of the magnetic domain wall movement element 100 decreases when the magnetization of the wiring layer 17 at a position overlapping the ferromagnetic layer 60 is tilted from a predetermined direction (for example, the z direction). When the thickness of the main portion 23B is substantially constant, the interface between the main portion 23B and the wiring layer 17 is flattened, and it is possible to prevent the magnetization from tilting from a predetermined direction.

Further, also in the first modified example, the average thickness of the non-magnetic layer 20 between the first conductive layer 30 or the second conductive layer 40 and the wiring layer 17 is preferably 10 Å or less.

In the magnetic domain wall movement element 101 according to the first modified example, the first conductive layer 30 and the wiring layer 17 are partly in direct contact with each other and partly in contact with each other via the non-magnetic layer 23. Therefore, the magnetic domain wall movement element 101 according to the first modified example also has the same effect as the magnetic domain wall movement element 100.

Second Modified Example

Figure 8:
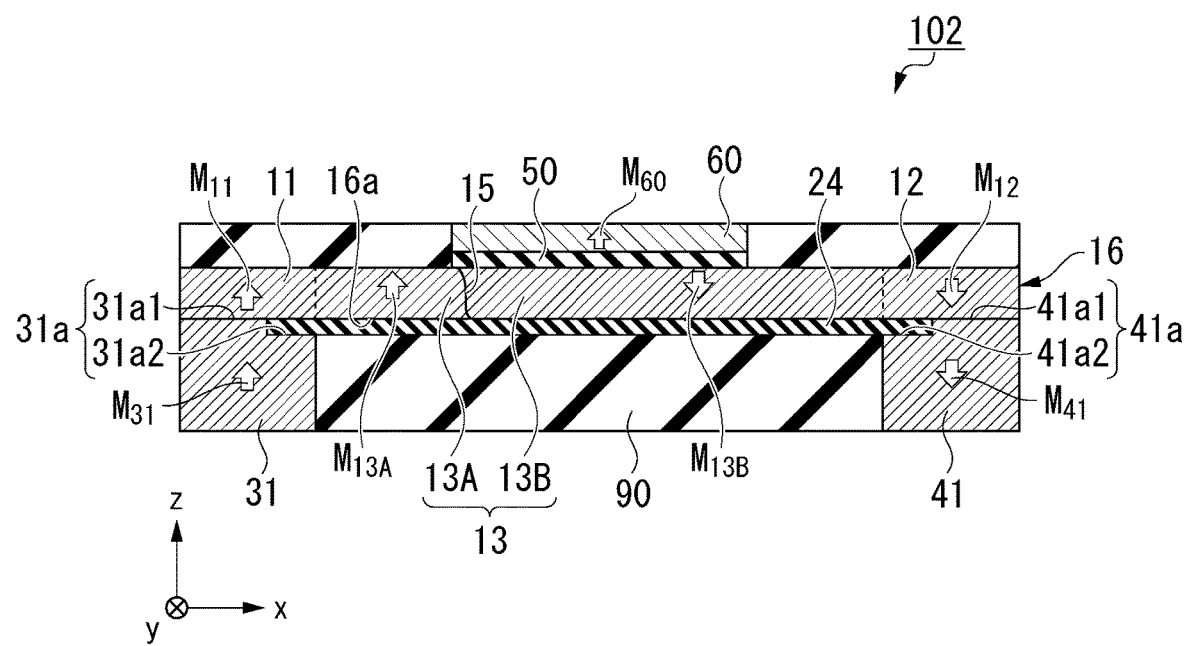
FIG. 8 is a cross-sectional view of a magnetic domain wall movement element according to a second modified example.

FIG. 8 is a cross-sectional view of the magnetic domain wall movement element 102 according to the second modified example on the yz plane. The position of the non-magnetic layer 24, and the shapes of the wiring layer 16, the first conductive layer 31 and the second conductive layer 41 of the magnetic domain wall movement element 102 are different from those of the magnetic domain wall movement element 100. The wiring layer 16 corresponds to the above-mentioned wiring layer 10, the non-magnetic layer 24 corresponds to the above-mentioned non-magnetic layer 20, the first conductive layer 31 corresponds to the above-mentioned first conductive layer 30, and the second conductive layer 41 corresponds to the above-mentioned second conductive layer 40. The same components as those of the magnetic domain wall movement element 100 in the magnetic domain wall movement element 102 are designated by the same reference numerals, and the description thereof will be omitted.

The thickness of the wiring layer 16 is substantially constant in the x direction. The first surface 16a of the wiring layer 16 has no depression and is flat.

The non-magnetic layer 24 is in contact with the first surface 16a of the wiring layer 16. The non-magnetic layer 24 is on the first surface 16a of the wiring layer 16. The non-magnetic layer 24 straddles a part of the fixed magnetization region 11, the magnetic domain wall movement region 13, and a part of the fixed magnetization region 12. The first end of the non-magnetic layer 24 is located between the fixed magnetization region 11 and the first conductive layer 31. The second end of the non-magnetic layer 24 is located between the fixed magnetization region 12 and the second conductive layer 41.

A part of the first conductive layer 31 is in direct contact with the wiring layer 16, and a part of the first conductive layer 31 is in contact with the wiring layer 16 via the non-magnetic layer 24. The first part 31a1 of the connection surface 31a is in direct contact with the wiring layer 16, and the second part 31a2 is in contact with the wiring layer 16 via the non-magnetic layer 24. The second portion 31a2 of the connecting surface 31a is recessed in the z direction with respect to the first portion 31a1. The non-magnetic layer 24 is fitted in the recess of the first conductive layer 31.

A part of the second conductive layer 41 is in direct contact with the wiring layer 16, and a part of the second conductive layer 41 is in contact with the wiring layer 16 via the non-magnetic layer 24. The first part 41a1 of the connection surface 41a is in direct contact with the wiring layer 16, and the second part 41a2 is in contact with the wiring layer 16 via the non-magnetic layer 24. The second portion 41a2 of the connection surface 41a is recessed in the z direction with respect to the first portion 41a1. The non-magnetic layer 24 is fitted in the recess of the second conductive layer 41.

In the magnetic domain wall movement element 102 according to the second modified example, the first conductive layer 31 and the wiring layer 16 are partly in direct contact with each other and partly in contact with each other via the non-magnetic layer 24. Therefore, the magnetic domain wall movement element 102 according to the second modified example also has the same effect as the magnetic domain wall movement element 100. Further, since the first surface 16a of the wiring layer 16 is flat, it is possible to suppress the disturbance of the orientation direction of the magnetization of the wiring layer 16 and to prevent the magnetic domain wall 15 from being trapped.

Figure 9:
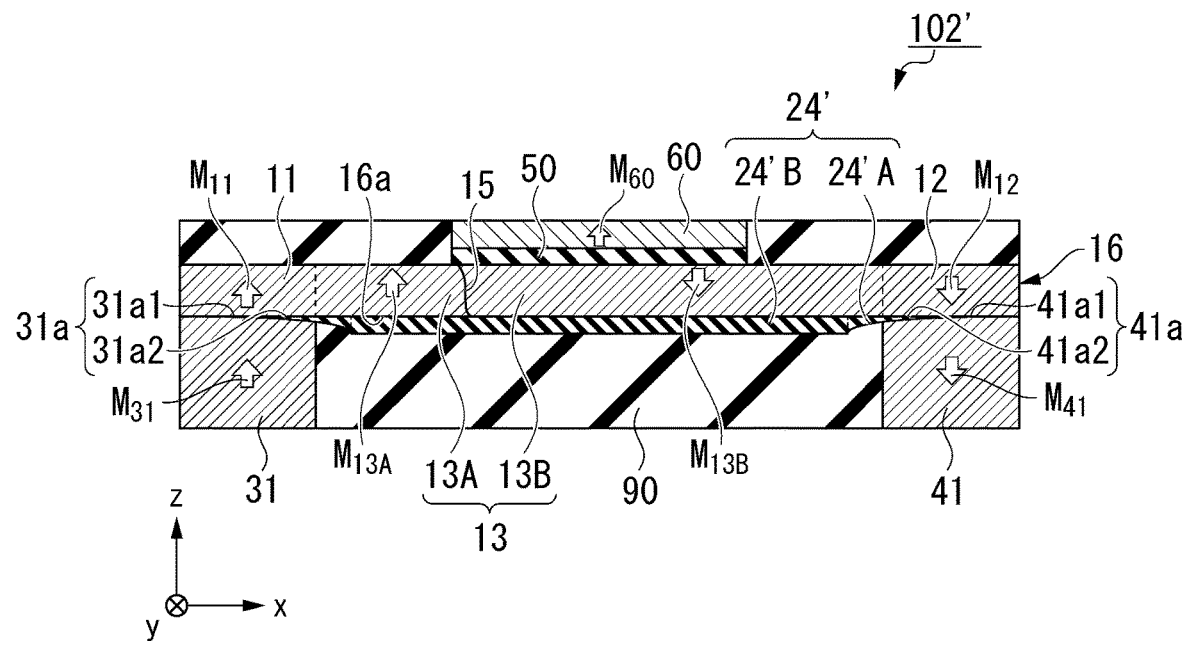
FIG. 9 is a cross-sectional view of a magnetic domain wall movement element according to another example of the second modified example.

FIG. 9 is a cross-sectional view of the magnetic domain wall movement element 102' related to another example of the second modified example on the yz plane. The magnetic domain wall movement element 102' has a different shape from the magnetic domain wall movement element 102 in the non-magnetic layer 24'.

The non-magnetic layer 24' is different from the non-magnetic layer 24 in that it has a thickness changing portion 24A', and is common to the non-magnetic layer 23. The non-magnetic layer 24' has a thickness changing portion 24'A in which the thickness thereof gradually decreases and a main portion 24'B in which the thickness thereof is substantially constant. The thickness of the thickness changing portion 24A' becomes thinner as the distance from the midpoint in the x direction of the non-magnetic layer 24 increases. The thickness of the thickness changing portion 24A' becomes thinner, for example, as the distance from the ferromagnetic layer 60 increases. The main portion 24'B is located at a position that overlaps with the ferromagnetic layer 60 when viewed from the z direction. The thickness changing portion 24A' is located at a position that does not overlap with the ferromagnetic layer 60 when viewed from the z direction.

Also in the magnetic domain wall movement element 102', the first conductive layer 31 and the wiring layer 16 are partly in direct contact with each other and partly in contact with each other via the non-magnetic layer 24'. Therefore, the magnetic domain wall movement element 102' also has the same effect as the magnetic domain wall movement element 100. Further, since the non-magnetic layer 24' has a thickness changing portion 24', the magnetic domain wall movement element 102' results in the same effect as the magnetic domain wall movement element 102.

Third Modified Example

Figure 10:
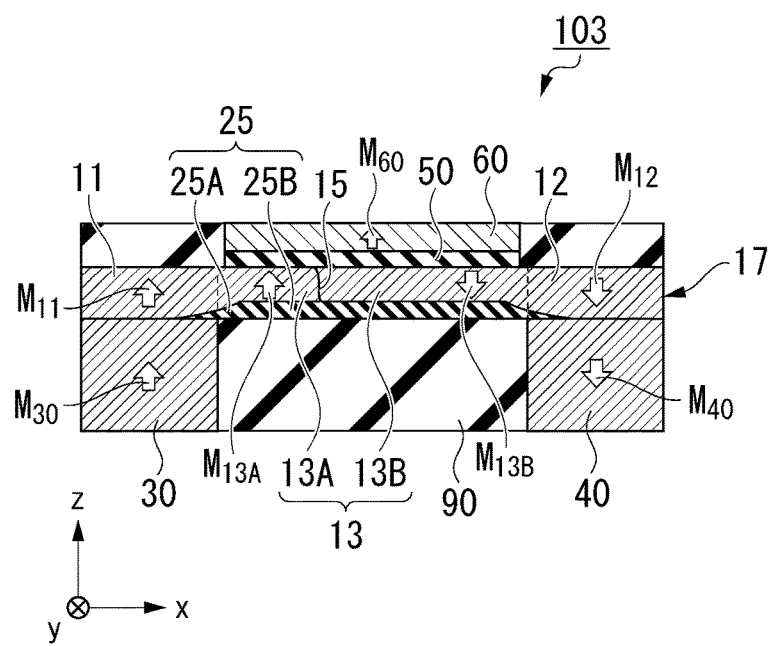
FIG. 10 is a cross-sectional view of a magnetic domain wall movement element according to a third modified example.

FIG. 10 is a cross-sectional view of the magnetic domain wall movement element 103 according to the third modified example on the yz plane. The shape of the wiring layer 17 and the positional relationship of the non-magnetic layer 25 of the magnetic domain wall movement element 103 are different from those of the magnetic domain wall movement element 100. The wiring layer 17 corresponds to the wiring layer 10 described above, and the non-magnetic layer 25 corresponds to the non-magnetic layer 20 described above. The same components as those of the magnetic domain wall movement element 101 in the magnetic domain wall movement element 103 are designated by the same reference numerals, and the description thereof will be omitted.

The non-magnetic layer 25 has a thickness changing portion 25A and a main portion 25B. The thickness of the thickness changing portion 25A becomes thinner as the distance from the midpoint in the x direction of the non-magnetic layer 25 increases. The thickness of the thickness changing portion 25A becomes thinner, for example, as the distance from the ferromagnetic layer 60 increases.

The main portion 25A is located at a position that overlaps with the ferromagnetic layer 60 when viewed from the z direction. By extending the thickness changing portion 25A to a position where it overlaps with the ferromagnetic layer 60, the rate of change of the inclination angle of the magnetization of the wiring layer 17 on the thickness changing portion 25A can be made slower than that of the magnetic domain wall movement element 101. Further, by extending the thickness changing portion 25A to a position where it overlaps with the ferromagnetic layer 60, the distance between the ferromagnetic layer 60 and the first and second conductive layers 30, 40 can be shortened, and the integration of the magnetic domain wall movement element 103 can be achieved.

Further, also in the third modified example, the average thickness of the non-magnetic layer 25 between the first conductive layer 30 or the second conductive layer 40 and the wiring layer 17 is preferably 10 Å or less.

Also in the magnetic domain wall movement element 103 according to the third modified example, the first conductive layer 33 and the wiring layer 17 are partly in direct contact with each other and partly in contact with each other via the non-magnetic layer 25. Therefore, the magnetic domain wall movement element 103 according to the third modified example also has the same effect as the magnetic domain wall movement element 100.

Fourth Modified Example

Figure 11:
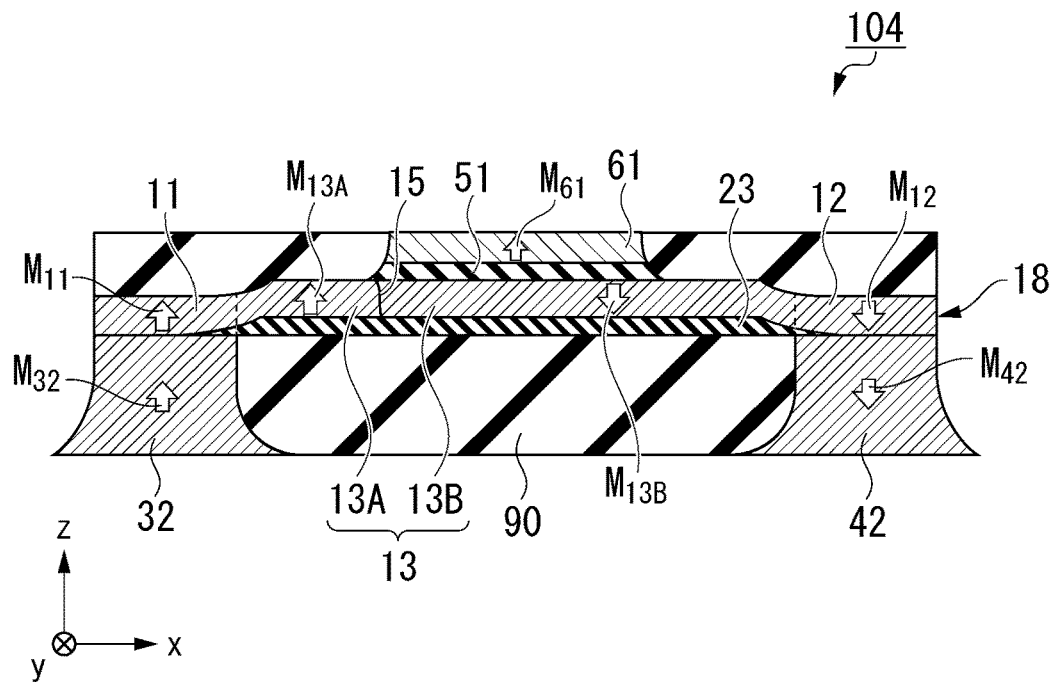
FIG. 11 is a cross-sectional view of a magnetic domain wall movement element according to a fourth modified example.

FIG. 11 is a cross-sectional view of the magnetic domain wall movement element 104 according to the fourth modified example on the yz plane. The shapes of the wiring layer 18, the first conductive layer 32, the second conductive layer 42, the non-magnetic layer 51, and the ferromagnetic layer 61 of the magnetic domain wall movement element 104 are different from those of the magnetic domain wall movement element 101. The wiring layer 18 corresponds to the wiring layer 10 described above, the first conductive layer 32 corresponds to the first conductive layer 30 described above, the second conductive layer 42 corresponds to the second conductive layer 40 described above, the non-magnetic layer 51 corresponds to the non-magnetic layer 50 described above, and the ferromagnetic layer 61 corresponds to the ferromagnetic layer 60 described above. The same components as those of the magnetic domain wall movement element 101 in the magnetic domain wall movement element 104 are designated by the same reference numerals, and the description thereof will be omitted.

The side surfaces of the first conductive layer 32, the second conductive layer 42, the second non-magnetic layer 51, and the ferromagnetic layer 61 are inclined. Each laminated surface of the wiring layer 18 reflects the shape of the non-magnetic layer 23.

In the magnetic domain wall movement element 104 according to the fourth modified example, the first conductive layer 32 and the wiring layer 18 are partly in direct contact with each other and partly in contact with each other via the non-magnetic layer 23. Therefore, the magnetic domain wall movement element 104 according to the fourth modified example also has the same effect as the magnetic domain wall movement element 100.

Second Embodiment

Figure 12:
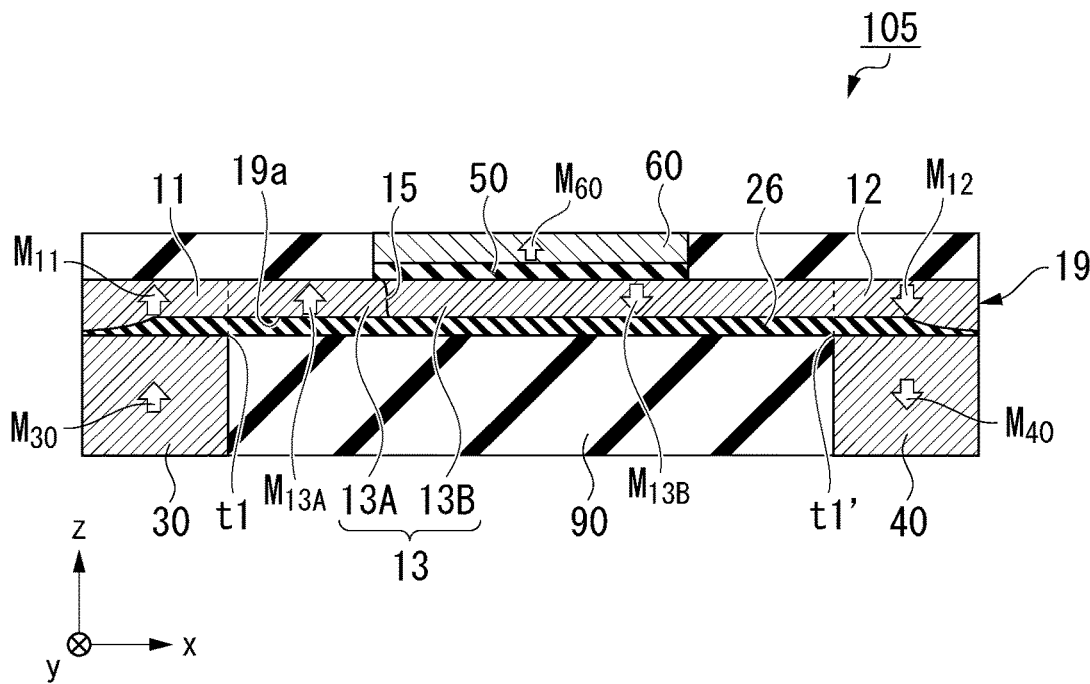
FIG. 12 is a cross-sectional view of a magnetic recording array according to a second embodiment.

FIG. 12 is a cross-sectional view of the magnetic domain wall movement element 105 according to the second embodiment on the yz plane. The shape of the wiring layer 19 and the nonmagnetic layer 26 of magnetic domain wall movement element 105 is different from that of the magnetic domain wall movement element 101. The wiring layer 19 corresponds to the wiring layer 10 described above, and the non-magnetic layer 26 corresponds to the non-magnetic layer 20 described above. The same components as those of the magnetic domain wall movement element 101 in magnetic domain wall movement element 105 are designated by the same reference numerals, and the description thereof will be omitted.

The non-magnetic layer 26 is in contact with the first surface 19a of the wiring layer 19. The non-magnetic layer 26 is on the first surface 19a of the wiring layer 19. The non-magnetic layer 26 straddles the fixed magnetization region 11, the magnetic domain wall movement region 13, and the fixed magnetization region 12.

The non-magnetic layer 26 extends from a position overlapping the magnetic domain wall movement region 13 in the z direction toward between the fixed magnetization region 11 and the first conductive layer 30 and between the fixed magnetization region 12 and the second conductive layer 40. There is a non-magnetic layer 26 between the fixed magnetization region 11 and the first conductive layer 30 and between the fixed magnetization region 12 and the second conductive layer 40. The non-magnetic layer 26 is made of the same material as the non-magnetic layer 20. The average thickness of the non-magnetic layer 26 between the first conductive layer 30 or the second conductive layer 40 and the wiring layer 19 is preferably 10 Å or less.

The thickness of the non-magnetic layer 26 at a position located between the first conductive layer 30 and the wiring layer 19 is thinner than the thickness of the non-magnetic layer 26 at a position which overlaps the first end t1 of the connection surface 30a of the first conductive layer 30 on the side near the second conductive layer 40 in plan view. The thickness of the non-magnetic layer 26 at a position located between the second conductive layer 40 and the wiring layer 19 is thinner than the thickness of the non-magnetic layer 26 at the position which overlaps the first end t1' of the connection surface 40a of the second conductive layer 40 on the side near the first conductive layer 30 in plan view.

If there is a thin portion of the non-magnetic layer 26 between the first conductive layer 30 and the wiring layer 19 and between the second conductive layer 40 and the wiring layer 19, in this portion the magnetic coupling between the first conductive layer 30 and the wiring layer 19 and the magnetic coupling between the second conductive layer 40 and the wiring layer 19 are strengthened. That is, the invasion of the magnetic domain wall 15 into the fixed magnetization regions 11 and 12 and the disappearance of the magnetic domain wall 15 are suppressed, and the operation of the magnetic domain wall movement element 100 is stabilized. Further, there is no step at the boundary between the fixed magnetization regions 11, 12 and the magnetic domain wall movement region 13, and the operation of the magnetic domain wall movement element 100 is stabilized.

Third Embodiment

Figure 13:
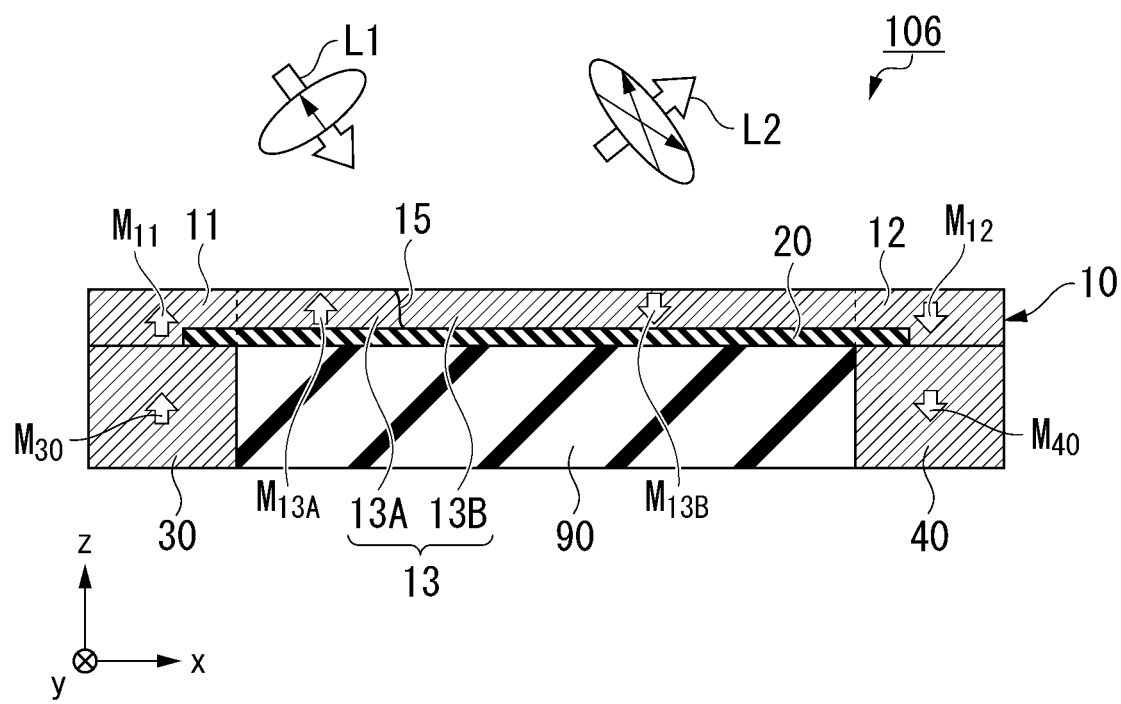
FIG. 13 is a cross-sectional view of a magnetic recording array according to a third embodiment.

FIG. 13 is a cross-sectional view of the magnetic domain wall movement element 106 according to the third embodiment on the yz plane. The magnetic domain wall movement element 106 is different from the magnetic domain wall movement element 100 in that it does not have the second non-magnetic layer 50 and the ferromagnetic layer 60. The same components as those of the magnetic domain wall movement element 101 in magnetic domain wall movement element 106 are designated by the same reference numerals, and the description thereof will be omitted.

The domain wall moving element 106 can be used as an optical modulator. Light L1 is incident on the wiring layer 10, and light L2 reflected by the wiring layer 10 is evaluated. Due to the magnetic Kerr effect, the deflection state of the light L2 reflected at the portion where the orientation direction of magnetization is different is different. The magnetic domain wall movement 106 can be used as an image display device utilizing the difference in the deflection state of the light L2.

Also in the magnetic domain wall movement element 103 according to the third embodiment, the first conductive layer 30 and the wiring layer 10 are partly in direct contact with each other and partly in contact with each other via the non-magnetic layer 20. Therefore, the magnetic domain wall movement element 106 according to the third embodiment also has the same effect as the magnetic domain wall movement element 100.

The preferred embodiments of the present invention have been described in detail above. The characteristic configurations in the respective embodiments and modifications may be combined.

EXPLANATION OF REFERENCES 10, 16, 17, 18, 19 Wiring layer
10a, 16a, 19a First surface
11, 12 Fixed magnetization region
13 Magnetic domain wall movement region
13A First magnetic domain
13B Second magnetic domain
15 Magnetic domain wall
20, 21, 22, 23, 24, 25, 26 Non-magnetic layer
22a, 30a, 40a Connection face
23A, 25A Thickness changing portion
23B, 25B Main portion
30, 31, 32 First conductive layer
30a1, 40a1 First portion
30a2, 40a2 Second portion
40, 41, 42 Second conductive layer
50, 51 Second non-magnetic layer
60, 61 Ferromagnetic layer
90 Insulating layer
100, 101, 102, 103, 104, 105, 106, 111, 112 Magnetic domain wall movement element
110 First switching element
120 Second switching element
130 Third switching element
200 Magnetic recording array
st Step
t1, t1' First end

What is claimed is:

1. A magnetic domain wall movement element comprising:
a wiring layer containing a ferromagnetic material;
a non-magnetic layer in contact with a first surface of the wiring layer;
a first conductive layer connected to the first surface of the wiring layer and containing a ferromagnetic material;
a second conductive layer connected to the wiring layer at a distance from the first conductive layer;
a first part of a connection face of the first conductive layer;
a part of the wiring layer that is in contact with the first part of the connection face;
a second part of the connection face other than the first part; and
another part of the wiring layer that is in contact with a part of the non-magnetic layer that is in contact with the second part.

2. The magnetic domain wall movement element according to claim 1, wherein an area of the first part is wider than an area of the second part.

3. The magnetic domain wall movement element according to claim 1, wherein the connection face of the first conductive layer is recessed in a lamination direction, and a part of the non-magnetic layer is fitted in the recess of the connection face.

4. The magnetic domain wall movement element according to claim 1, wherein the first surface of the wiring layer is recessed in a lamination direction, and the non-magnetic layer is fitted in the recess of the first surface.

5. The magnetic domain wall movement element according to claim 1, wherein the non-magnetic layer located between the first conductive layer and the wiring layer becomes thinner as it moves away from a first end of the connection face on a side near the second conductive layer.

6. The magnetic domain wall movement element according to claim 1, wherein an average thickness of the non-magnetic layer between the first conductive layer and the wiring layer is 10 Å or less.

7. The magnetic domain wall movement element according to claim 1, wherein the second conductive layer contains a ferromagnetic material and a part of the wiring layer is in contact with a first part of a connection face of the second conductive layer, and another part of the wiring layer is in contact with a part of the non-magnetic layer which is in contact with a second part of the connection face of the second conductive layer other than the first part.

8. The magnetic domain wall movement element according to claim 1, wherein the second conductive layer contains a ferromagnetic material and a thickness of the non-magnetic layer at a position located between the second conductive layer and the wiring layer is thinner than a thickness of the non-magnetic layer at a position which overlaps a first end of a connection face of the second conductive layer on a side near the first conductive layer in plan view.

9. The magnetic domain wall movement element according to claim 1, further comprising:
  a ferromagnetic layer located above a second surface of the wiring layer opposite the first surface; and
  a second non-magnetic layer located between the ferromagnetic layer and the wiring layer.

10. The magnetic domain wall movement element according to claim 9, wherein the non-magnetic layer has a thickness changing portion that becomes thinner as a distance from the ferromagnetic layer increases and the thickness changing portion does not overlap the ferromagnetic layer when viewed from a lamination direction.

11. The magnetic domain wall movement element according to claim 9, wherein the non-magnetic layer has a thickness changing portion that becomes thinner as a distance from the ferromagnetic layer increases and a part of the thickness changing portion overlaps the ferromagnetic layer when viewed from a lamination direction.

12. A magnetic recording array comprising a plurality of the magnetic domain wall movement elements according to claim 1.

13. A magnetic domain wall movement element, comprising:
  a wiring layer containing a ferromagnetic material;
  a non-magnetic layer in contact with a first surface of the wiring layer;
  a first conductive layer connected to the first surface of the wiring layer and containing a ferromagnetic material; and
  a second conductive layer connected to the wiring layer at a distance from the first conductive layer,
  wherein the first conductive layer is connected to the wiring layer via the non-magnetic layer, and
  a thickness of the non-magnetic layer at a position located between the first conductive layer and the wiring layer is thinner than a thickness of the non-magnetic layer at a position which overlaps a first end of a connection face of the first conductive layer on a side near the second conductive layer in plan view.

14. The magnetic domain wall movement element according to claim 13, wherein the non-magnetic layer located between the first conductive layer and the wiring layer becomes thinner as it moves away from the first end of the connection face on the side near the second conductive layer.

15. The magnetic domain wall movement element according to claim 13, wherein an average thickness of the non-magnetic layer between the first conductive layer and the wiring layer is 10 Å or less.

16. The magnetic domain wall movement element according to claim 13, wherein the second conductive layer contains a ferromagnetic material and a part of the wiring layer is in contact with a first part of a connection face of the second conductive layer, and another part of the wiring layer is in contact with a part of the non-magnetic layer which is in contact with a second part of the connection face of the second conductive layer other than the first part.

17. The magnetic domain wall movement element according to claim 13, wherein the second conductive layer contains a ferromagnetic material and a thickness of the non-magnetic layer at a position located between the second conductive layer and the wiring layer is thinner than a thickness of the non-magnetic layer at a position which overlaps a first end of a connection face of the second conductive layer on a side near the first conductive layer in the plan view.

18. The magnetic domain wall movement element according to claim 13, further comprising:
  a ferromagnetic layer located above a second surface of the wiring layer opposite the first surface; and
  a second non-magnetic layer located between the ferromagnetic layer and the wiring layer.

19. The magnetic domain wall movement element according to claim 15, wherein the non-magnetic layer has a thickness changing portion that becomes thinner as a distance from the ferromagnetic layer increases and the thickness changing portion does not overlap the ferromagnetic layer when viewed from a lamination direction.

20. The magnetic domain wall movement element according to claim 18, wherein the non-magnetic layer has a thickness changing portion that becomes thinner as a distance from the ferromagnetic layer increases and a part of the thickness changing portion overlaps the ferromagnetic layer when viewed from a lamination direction.

21. A magnetic recording array comprising a plurality of the magnetic domain wall movement elements according to claim 13.

* * * * *